US012749916B2

(12) United States Patent
Yang

(10) Patent No.: US 12,749,916 B2
(45) Date of Patent: Sep. 29, 2026

(54) ENERGY COLLECTION SYSTEM AND METHOD BASED ON EARTH ATMOSPHERE ENERGY STORAGE, AND ENERGY STORAGE APPARATUS

(71) Applicant: NANJING LINGJI YIDONG DRIVE TECHNOLOGY CO., LTD, Nanjing (CN)

(72) Inventor: Bintang Yang, Nanjing (CN)

(73) Assignee: NANJING LINGJI YIDONG DRIVE TECHNOLOGY CO., LTD, Nanjing (CN)

( * ) Notice: Subject to any disclaimer, the term of this patent is extended or adjusted under 35 U.S.C. 154(b) by 224 days.

(21) Appl. No.: 18/710,193

(22) PCT Filed: Nov. 15, 2022

(86) PCT No.: PCT/CN2022/131957
§ 371 (c)(1),
(2) Date: May 15, 2024

(87) PCT Pub. No.: WO2023/093571
PCT Pub. Date: Jun. 1, 2023

(65) Prior Publication Data
US 2025/0023387 A1 Jan. 16, 2025

(30) Foreign Application Priority Data
Nov. 26, 2021 (CN) ......................... 202111424629.5

(51) Int. Cl.
*H02J 15/00* (2026.01)
*H05K 5/06* (2006.01)

(52) U.S. Cl.
CPC .............. *H02J 15/00* (2013.01); *H05K 5/069* (2013.01)

(58) Field of Classification Search
CPC ........... H02J 15/00; F04B 35/00; F03B 13/00; H05K 5/069
See application file for complete search history.

(56) References Cited

FOREIGN PATENT DOCUMENTS

CN 201714987 U 1/2011
CN 101445202 B 9/2011
(Continued)

OTHER PUBLICATIONS

CN110513254A—Translation (Year: 2026).*
(Continued)

*Primary Examiner* — Christopher M Koehler
*Assistant Examiner* — Ahmed F Seck
(74) *Attorney, Agent, or Firm* — Bayramoglu Law Offices LLC

(57) ABSTRACT

The system includes an energy storage housing, a transmission part, a power source, and a locking assembly, where the energy storage housing provides a carrier for energy storage; the transmission part has a sealed end slidably arranged inside the energy storage housing, and a sealed space is formed between the sealed end and the energy storage housing; the power source can drive the sealed end to move from a first position to a second position of the energy storage housing and can form a vacuum inside the sealed space; the locking assembly enables the transmission part to have a locking state and an unlocking state, and when the transmission part is in the unlocking state, the sealed end is movable in a direction from the second position to the first position under the action of earth atmosphere so that negative pressure energy in the sealed space is released.

19 Claims, 13 Drawing Sheets

(56) References Cited

FOREIGN PATENT DOCUMENTS

| | | | | | |
|---|---|---|---|---|---|
| CN | 202613304 | U | | 12/2012 | |
| CN | 103147928 | A | | 6/2013 | |
| CN | 103370495 | A | | 10/2013 | |
| CN | 104595137 | A | * | 5/2015 | F03G 7/05 |
| CN | 106438178 | A | * | 2/2017 | F03B 13/14 |
| CN | 206221130 | U | | 6/2017 | |
| CN | 110513254 | A | * | 11/2019 | F03G 1/00 |
| CN | 114123523 | A | | 3/2022 | |
| DE | 3013329 | A1 | | 1/1982 | |
| DE | 102009025139 | A1 | | 12/2010 | |
| FR | 849851 | A | | 12/1939 | |
| WO | 2018073682 | A1 | | 4/2018 | |

OTHER PUBLICATIONS

18710193_2026-01-27_CN_104595137_A_H.pdf (Year: 2026).*
Cn110513254A_-_Translation.pdf (Year: 2026).*
18710193_2026-01-27_CN_106438178_A_H.pdf (Year: 2026).*
18710193_2026-06-22_CN_104595137_A_H.pdf (Year: 2026).*

* cited by examiner

ENERGY COLLECTION SYSTEM AND METHOD BASED ON EARTH ATMOSPHERE ENERGY STORAGE, AND ENERGY STORAGE APPARATUS

CROSS REFERENCE TO THE RELATED APPLICATIONS

This application is the national phase entry of International Application No. PCT/CN2022/131957, filed on Nov. 15, 2022, which is based upon and claims priority to Chinese Patent Application No. 202111424629.5, filed on Nov. 26, 2021, the entire contents of which are incorporated herein by reference.

TECHNICAL FIELD

The present invention relates to the technical field of energy storage, and specifically, to an energy collection system and method based on earth atmosphere energy storage, and an energy storage apparatus.

BACKGROUND

Energy exists in various forms and can be classified into nuclear energy, mechanical energy, chemical energy, thermal energy, electrical energy, radiant energy, light energy and so on according to different motion forms of matter. The collection, storage and flexible application of the energy are very crucial. Especially in nature and human activities, there is a lot of stable or unstable energy, such as sea tides, crashing waves, falling objects, spring rebound, gas expansion, explosive/nuclear blasting, windmill, hydraulic or solar power generation, people walking on the ground, vehicles running on the road, electromechanical system energy, vibration impact energy, sound energy, thermal energy and so on, all of which are accompanied by accumulation and dissipation of instantaneous or variable energy and are often transmitted or dissipated by means of medium transmission, friction, kinetic and potential energy conversion, thermal energy conversion or radiation, such that motion or energy often cannot be controlled and collected and thus cannot be utilized or is difficult to utilize.

Even if there are some energy collection devices, they are also limited by external environments, and most of them have certain limitations in use, are complex in structure, are inconvenient in energy storage and release, or the like, which greatly limits implementation of energy storage and release.

In the patent document CN101445202B, a motion and mechanical energy storage and release apparatus, particularly an energy-saving lifting apparatus for storing energy by using a flat spiral spring to implement smooth release is disclosed. The lifting apparatus includes a machine base, an electric motor, a reduction gearbox, a carrying box driven by a steel rope on a reel, and a driving shaft that drives the reel to rotate and is divided into a left section and a right section by the reel, where one section is connected to the reduction gearbox by a clutch, and the other section is connected in parallel to a plurality of energy storage apparatuses internally provided with flat spiral springs by a plurality of clutches. The energy storage apparatus includes a driven shaft and a flat spiral spring, where the driven shaft is a hollow shaft, the driving shaft passes through the hollow shaft, and an input end of the driven shaft is connected to the driving shaft by a clutch. After the clutch is engaged, the driven shaft and the driving shaft synchronously rotate, and the energy storage apparatus can store or release energy when the carrying box descends or ascends. However, this design needs to rely on the particularity of height during motion and thus is not universal. Additionally, in the patent document CN202613304U, a sunlight direct storage and release apparatus is disclosed, including an automatic tracking and condensing system, a lead-in optical fiber, a vacuum annular tube, an optical switch, a lead-out optical fiber, and a light release apparatus. The lead-in optical fiber has one end connected to the automatic tracking and condensing system and the other end connected to a light inlet of the vacuum annular tube. Sunlight focused by the automatic tracking and condensing system in the daytime is introduced into the vacuum annular tube and circulates in the vacuum annular tube all the time. The lead-out optical fiber has one end connected to a light outlet of the vacuum annular tube and the other end connected to the light release apparatus. The optical switch is disposed on the lead-out optical fiber. When the sunlight circulating in the vacuum annular tube all the time is needed for illumination, the optical switch is turned on, such that part of the sunlight enters the light release apparatus by the lead-out optical fiber to irradiate a required occasion. However, this design is restricted by weathers, does not facilitate collection of energy in a cloudy and rainy weather, and thus is not universal.

SUMMARY

In view of the defects in the prior art, the present invention aims to provide an energy collection system and method based on earth atmosphere energy storage, and an energy storage apparatus.

An energy collection system based on earth atmosphere energy storage provided according to an embodiment of the present invention includes:

an energy storage housing providing a carrier for energy storage;

a transmission part having a sealed end, where the sealed end is slidably arranged inside the energy storage housing, and a sealed space is formed between the sealed end and the energy storage housing;

a power source capable of driving the sealed end to move from a first position to a second position of the energy storage housing and capable of making it possible to form a vacuum inside the sealed space; and a locking assembly enabling the transmission part to have a locking state and an unlocking state, where when the transmission part is in the unlocking state, the sealed end is movable in a direction from the second position to the first position under the action of earth atmosphere so that negative pressure energy in the sealed space is released, and an action of the locking assembly is capable of being performed in any one of the following manners:

manual control;

program control, where a program is settable so that the locking assembly is performed in a continuous or discontinuous state at a preset time point or in a preset time period, or the locking assembly is performed based on conditional information; and combination of manual control with program control.

Further, the power source is capable of being in any one or more forms of wind energy, solar energy, chemical energy, thermal energy, electrical energy, radiant energy, nuclear energy, kinetic energy, potential energy, biological energy, tidal energy, magnetic and electromagnetic energy, and physical phase change energy.

Further, the transmission part has an output end; and due to the sealed end being pushed, the output end being pulled, or combination of being pushed and pulled, the sealed end moves from the first position to the second position.

Further, the output end extends outside the energy storage housing.

Further, a vacuum environment in the sealed space is formed by motion of the sealed end and/or by means of vacuumizing.

Further, the sealed end along the direction from the second position to the first position includes first piston bodies, second piston bodies, and flexible bodies arranged between the first piston bodies and the second piston bodies, which are sequentially sleeved on the transmission part at intervals and matched with the energy storage housing, and when the sealed space is in a negative pressure state, part of the flexible bodies are squeezed into gaps between the second piston bodies and the energy storage housing under the action of an atmospheric pressure so that the sealed space is sealed.

Further, one of the first piston bodies, one of the second piston bodies, and one of the flexible bodies form a sealing assembly; and the number of sealing assemblies on the transmission part is capable of being configured to be one or above.

Further, the locking assembly is in any one form of buckle locking, hole and pin type locking, electromagnetic force locking, thermal expansion locking, structural interference locking, pneumatic and hydraulic locking, ratchet mechanism locking, gluing locking, reaction force locking, and welding locking.

Further, when the transmission part is in the locking state or the unlocking state, the transmission part is allowed to move in a direction from the first position to the second position.

Further, a conical space is formed in the energy storage housing and has a small opening end facing the sealed space, and the locking assembly includes a trigger body, a locking support member, and a potential energy storage part;

the potential energy storage part has one end connected to the energy storage housing and arranged at a large opening end of the conical space, and the other end connected to the locking support member, the transmission part penetrates through the conical space, and the locking support member and the potential energy storage part are both arranged along a circumferential direction of the transmission part;

when the trigger body is operated, the locking support member is capable of being driven to move towards the large opening end so that the transmission part is in the unlocking state; and when the trigger body is not operated, the potential energy storage part is capable of driving the locking support member to move towards the small opening end under the action of an elastic force thereof so that the transmission part is in the locking state.

Further, the transmission part has a third state between the locking state and the unlocking state, and the third state is capable of maintaining uniform, accelerated, or decelerated motion of the transmission part during the process that the negative pressure energy is released.

Further, the power source includes any one of the following structural combination forms:

a fluid transfer pump configured to perform vacuumizing and fluid filling on the sealed space;

a fluid transport pump and an electric motor, where the fluid transport pump is configured to perform vacuumizing, and the electric motor is capable of being driven by the transmission part to generate power;

a fluid transport pump configured to perform vacuumizing; and an electric motor capable of driving the sealed end to move from the first position to the second position, and having a power generation function, or the electric motor only having the power generation function.

Further, a first spring is disposed in the sealed space, the first spring has one end connected to the sealed end and the other end connected to the energy storage housing, and the first spring is always in a compressed state.

Further, a control mechanism is included, where the control mechanism is in signal connection with the power source and the locking assembly so that the negative pressure energy is released or supplemented in a set manner.

An energy storage apparatus provided according to the present invention includes a plurality of energy collection systems based on earth atmosphere energy storage that are arranged in series or in parallel.

Further, different energy collection systems based on earth atmosphere energy storage are implemented in any one or more of the following forms:

respective transmission parts have the same, partially identical, or totally different heights and/or orientations;

respective transmission parts have the same, partially identical, or totally different structures;

respective transmission parts have the same, partially identical, or totally different states, and the states are positional states of the transmission parts between a first position and a second position;

respective locking assemblies have the same, partially identical, or totally different structures; and respective power sources are in the same, partially identical, or totally different forms.

An energy collection method based on earth atmosphere energy storage provided according to the present invention includes:

S1: enabling external energy to act on a transmission part for one or multiple times so that a sealed end of the transmission part moves in a first direction to expand a sealed space between the sealed end and an energy storage housing carrying the sealed end, and due to a locking assembly on the transmission part, not allowing the sealed end to move in a second direction, where the sealed space is a negative pressure space, and the first direction is opposite to the second direction; and S2: when the locking assembly is unlocked, enabling the sealed end to move in the second direction under the action of earth atmosphere.

Further, the sealed end is movable between a first position and a second position in the energy storage housing, and a direction of motion from the first position to the second position is the first direction, where when the sealed end is located between the first position and the second position, S1 and S2 are performed sequentially or alternately;

when the sealed end is located in the first position, S1 and S2 are performed sequentially; and when the sealed end is located in the second position, S2 is performed first and then S1 is performed.

BRIEF DESCRIPTION OF DRAWINGS

Other features, objectives and advantages of the present invention will become more apparent upon reading the detailed description of the non-restrictive embodiments with reference to the following drawings, in which.

In the drawings.

Figure 1:
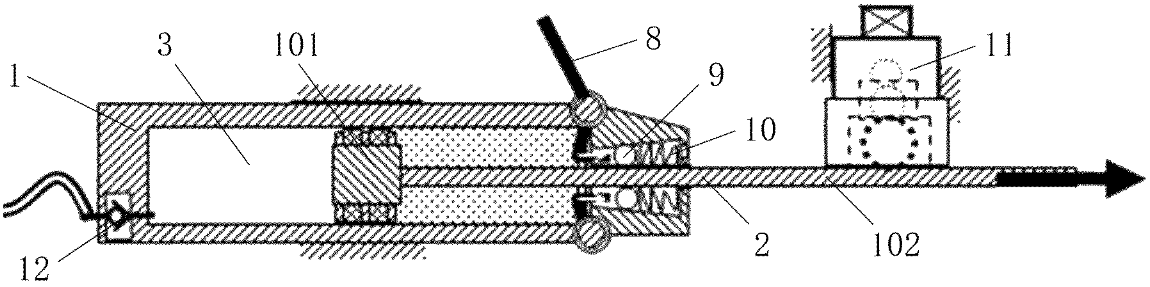
FIG. 1 is a schematic structural diagram of the present invention.

| |
|---|
| energy storage housing 1 |
| transmission part 2 |
| sealed space 3 |
| first piston body 4 |
| second piston body 5 |
| flexible body 6 |
| first spring 7 |
| trigger body 8 |
| rolling element 9 |
| second spring 10 |
| electric motor 11 |
| first valve 12 |
| second valve 13 |
| third valve 14 |
| fourth valve 15 |
| common chamber 16 |
| transmission rod 17 |
| transmission frame 18 |
| energy body 19 |
| first permanent magnet 20 |
| second permanent magnet 21 |
| first electromagnet 22 |
| second electromagnet 23 |
| sealing groove 24 |
| first bag body 25 |
| second bag body 26 |
| paraffin 27 |
| tin-bismuth alloy 28 |
| locking stopper block 29 |
| locking groove 30 |
| first moving block 31 |
| second moving block 32 |
| stopping tooth 33 |
| accommodating space 34 |
| locking structure body 35 |
| third spring 36 |
| unlocking functional part 37 |
| stationary shaft 38 |
| sealed end 101 |
| output end 102 |

DETAILED DESCRIPTION OF EMBODIMENTS

The present invention is described in detail below with reference to specific embodiments. The following embodiments will assist those skilled in the art in further understanding the present invention, but do not limit the present invention in any form. It is to be pointed out that several changes and improvements may also be made by those of ordinary skill in the art without departing from the conception of the present invention. All the changes and improvements fall within the scope of protection of the present invention.

Embodiment 1

One embodiment of the present invention provides an energy collection system based on earth atmosphere energy storage, including an energy storage housing 1, a transmission part 2, a power source, and a locking assembly, where the energy storage housing 1 provides a carrier for energy storage; the transmission part 2 has a sealed end 101 movably arranged inside or outside the energy storage housing 1, and a sealed space 3 is formed between the sealed end and the energy storage housing 1; the power source can drive the sealed end 101 to move from a first position to a second position of the energy storage housing 1 and can form a vacuum inside the sealed space 3; the locking assembly enables the transmission part 2 to have a locking state and an unlocking state, and when the transmission part 2 is in the unlocking state, the sealed end 101 is movable in a direction from the second position to the first position under the action of earth atmosphere so that negative pressure energy in the sealed space 3 is released, where an action of the locking assembly can be performed in any one of the following manners:

- manual control, in which the locking assembly is directly controlled manually and is adjusted to be in the locking state or the unlocking state manually; and
- program control, in which a program is settable so that the locking assembly is performed in a continuous or discontinuous state at a preset time point or in a preset time period, or the locking assembly is performed based on conditional information to match the demand for energy release and meet the requirements of the product. The conditional information can be understood to cause the state of the locking assembly to be changed based on a trigger signal. For example, when a sensor obtains a sensing pressure that has reached a set threshold, a pressure signal of the sensor triggers the program to control the action of the locking assembly to be performed and to make the locking assembly enter the unlocking state from the locking state so that the negative pressure energy is released. After the negative pressure energy is released, the sensing pressure can be adjusted to make the system stable.

Further, in the present invention, the locking assembly may also be controlled by means of combination of manual control and program control.

It is to be pointed out that the sealed end 101 is arranged outside the energy storage housing 1, for example, a corrugated tube is sleeved outside the energy storage housing 1, a sealed space is formed between the corrugated tube and the inside of the energy storage housing 1, and energy storage and release are implemented during extension and retraction motion of the corrugated tube.

In one embodiment of the present invention, vacuum energy storage of the system is implemented by placing a sealed chamber in a vacuum state, and a driving force can be generated with a pressure difference between the earth atmosphere and the sealed chamber to implement motion of the transmission part 2, thereby implementing energy release or conversion. Equivalently, energy (various kinetic energy) is stored in the atmosphere and turns into atmospheric potential energy (the kinetic energy is converted into the potential energy, the atmosphere is a space for a potential energy conversion medium and is ubiquitous, any space can be used for storing the potential energy, without direction and position restrictions, and available media and spaces are relatively infinite), and the negative pressure energy in the sealed space 3 can be released under the action of an atmospheric pressure at any time as needed. The energy storage and release are less affected by external environments, without producing other garbage and environmental pollution. The system has good environmental friendliness and high flexibility, can be applied to various working conditions, and has good universality and practical value and significance for promotion.

Figure 6:
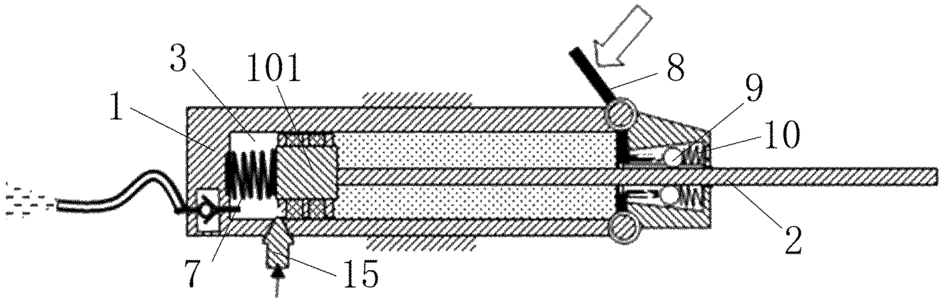
FIG. 6 is a schematic structural diagram in which a sealed end is in a first position when there is a first spring.

It is to be noted that the first position in the present invention is an initial position of the sealed end 101, and when the sealed end 101 is in the first position, the sealed space 3 has a minimum volume; and the second position is a position when the sealed end 101 moves away from the first position to the maximum extent, and when the sealed end 101 is in the second position, the sealed space 3 has a maximum volume. The understanding of the maximum volume and the minimum volume is different for different structures and application environments. For example, first positions in two structures in FIG. 1 and FIG. 6 are different. In FIG. 1, when the sealed end 101 is in the first position, the volume of the sealed space 3 is 0 or close to 0. However, in FIG. 6, due to the existence of a first spring 7, the volume of the sealed space 3 is still greater than 0 when the sealed end 101 is in the first position. Therefore, the first position and the second position in the present invention should be reasonably understood according to the actual product.

In practical application, a vacuum environment in the sealed space 3 is formed by motion of the sealed end 101 or by means of vacuumizing. As shown in FIG. 1, when the sealed space is in a sealed state, the sealed end 101 is directly pushed or pulled rightwards to form the vacuum in the sealed space; alternatively, in a case where the sealed space 3 communicates with the outside atmosphere, the sealed end 101 is first pushed or pulled rightwards, then the sealed space 3 is isolated from the outside atmosphere such that the sealed space 3 is vacuumized, or vacuumizing and pulling/pushing form a vacuum composite effect, such that the vacuum formation efficiency or the vacuum degree is higher. The two ways both can enable the sealed space 3 to be in a vacuum state and specifically should be flexibly selected according to specific application scenes in practical application.

Further, the transmission part 2 has an output end 102; and during the energy collection process of the system, the sealed end 101 can be moved from the first position to the second position by means of pushing the sealed end 101, pulling the output end 102 or both of pushing the sealed end 101 and pulling the output end 102, wherein a pushing or pulling force during the process comes from the power source.

In the present invention, the power source should be broadly understood, and in some embodiments, the power source may only be used as an energy source of stored energy in the present invention, or may not only be used as the energy source of the stored energy in the present invention, but also play a role of energy conversion when the negative pressure energy of the system in the present invention is released, for example, the power source includes a generator. While the negative pressure energy is released, the generator converts the negative pressure energy into electric energy for application. Therefore, the power source in the present invention has various implementable structures or combinations thereof, and should be configured according to different application scenes.

Further, the power source in the present invention can be in any one form or combination of various forms of energy to implement storage of the negative pressure energy, where the energy includes, for example, wind energy (wind power is used to generate energy), solar energy (the solar energy such as solar panels and sunlight is used to generate energy), chemical energy (chemical reactions are used to generate energy, such as energy generated by combustion, explosion, etc.), thermal energy (such as heat of combustion, heat of electromagnetic eddy currents, heat of resistors, and geothermal energy), electrical energy, radiant energy (a sum of energy of electric fields and energy of magnetic fields in electromagnetic waves), nuclear energy, kinetic energy (energy generated by mechanical motion and inertial motion), potential energy (such as gravitational potential energy and elastic potential energy), biological energy (energy generated by motion of animal bodies, extension and retraction of animals and plants, microorganisms, etc., such as anaerobic fermentation), tidal energy (energy in periodic flux and reflux of sea water, with a water level difference expressed as potential energy and a tidal velocity expressed as kinetic energy), magnetic and electromagnetic energy (energy generated by magnetic fields, electromagnetic fields, etc.), and physical phase change energy (due to phase change of matter, especially energy generated during solid to liquid to gas expansion).

In practical application, the output end 102 may be disposed inside or on a surface of the energy storage housing 1, or may be disposed outside the energy storage housing 1. The output end 102 preferably extends outside the energy storage housing 1 and is connected to other structures. The output end is suitable for pushing, pulling and the like of external energy. Specifically, the ways to dispose the output end should be flexibly selected according to practical application scenes.

Specifically, the locking assembly can be implemented in any one of various forms, such as buckle locking, hole and pin type locking (a hole cooperates with a pin to implement locking and unlocking, and the pin is inserted into the hole during locking and is pulled out from the hole during unlocking), electromagnetic force locking (locking is implemented by a magnetic field force generated by electromagnetic induction), thermal expansion locking, structural interference locking, ratchet mechanism locking, pneumatic and hydraulic locking (a locking force is obtained by a pneumatic pressure or a hydraulic pressure), gluing locking (gluing locking is implemented by super glue), reaction force locking, and welding locking (locking is implemented by means of direct welding, and a welded part is broken for unlocking). The present invention is described below in a structural form of structural interference locking.

Specifically, a conical space is formed in the energy storage housing 1 and has a small opening end facing the sealed space 3. The locking assembly includes a trigger body 8, a locking support member, and a potential energy storage part, where the potential energy storage part has one end connected to the energy storage housing 1 and arranged at a large opening end of the conical space, and the other end connected to the locking support member, the transmission part 2 penetrates through the conical space, and the locking support member and the potential energy storage part are both arranged along a circumferential direction of the transmission part 2. When the trigger body 8 is operated, the locking support member can be driven to move towards the large opening end so that the transmission part 2 is in the unlocking state. When the trigger body 8 is not operated, the potential energy storage part can drive the locking support member to move towards the small opening end under the action of an elastic force of the potential energy storage part so that the transmission part 2 is in the locking state.

As shown in FIG. 1, in this embodiment, the trigger body 8 is preferably a driving rod, the locking support member is preferably a rolling element 9, such as a steel ball, the potential energy storage part is preferably a second spring 10, one end of the second spring 10 is connected to the energy storage housing 1 and faces the large opening end of the conical space, the other end of the second spring 10 is connected to the rolling element 9, the transmission part 2 penetrates through the conical space, and the rolling element 9 and the second spring 10 are both arranged along the circumferential direction of the transmission part 2.

Further, the driving rod is rotatably mounted on the energy storage housing 1, and has one end extending outside the energy storage housing 1 to serve as an executive end for operation, and the other end in contact with the rolling element 9. When the executive end of the driving rod is pressed by an external force, the other end of the driving rod can drive the rolling element 9 to move towards the large opening end. At this time, a frictional force between the rolling element 9 and the transmission part 2 is reduced to unlock the transmission part 2 so that the transmission part 2 is in the unlocking state. When the external force at the executive end of the driving rod is removed, the second spring 10 itself has a restoring force in a compressed state and extends to drive the rolling element 9 to move towards the small opening end and squeeze the transmission part 2, and the frictional force between the rolling element 9 and the transmission part 2 is increased so that the transmission part 2 returns to the locking state.

The rolling element 9 is preferably a steel ball. A certain frictional force exists between the steel ball and the transmission part 2. When the sealed end 101 moves toward the first position, the steel ball slightly moves with the transmission part 2 or only has a motion tendency to squeeze the transmission part 2 so as to lock the transmission part 2. When the sealed end 101 moves toward the second position, the steel ball slightly moves with the transmission part 2 or only has a motion tendency so that a gap is formed between the steel ball and the transmission part 2, thereby unlocking the transmission part 2. The precise control between unlocking and locking is implemented by the locking structure.

In this embodiment, when the transmission part 2 is in the locking state or the unlocking state, the transmission part 2 is allowed to move in a direction from the first position to the second position. When the transmission part 2 moves from the first position to the second position, due to the existence of the frictional force between the transmission part 2 and the rolling element 9, the rolling element 9 can be driven to move or generate a motion tendency so that the rolling element 9 generates a rightward motion tendency or a rightward movement displacement in FIG. 1, thereby reducing the frictional force between the transmission part 2 and the rolling element 9 to unlock the transmission part 2. When the transmission part 2 does not move, the rolling element 9 squeezes the transmission part 2 again under the action of the second spring 10 so that the transmission part 2 is locked. Therefore, the locking assembly can be driven by the external energy to drive the transmission part 2 to move in the direction from the first position to the second position at any time so as to complete energy collection, that is, the energy collection is not limited by the state of the locking assembly, but the energy can be released only after the transmission part 2 is unlocked. The structure is ingenious and is further described below by one embodiment.

Figure 13:
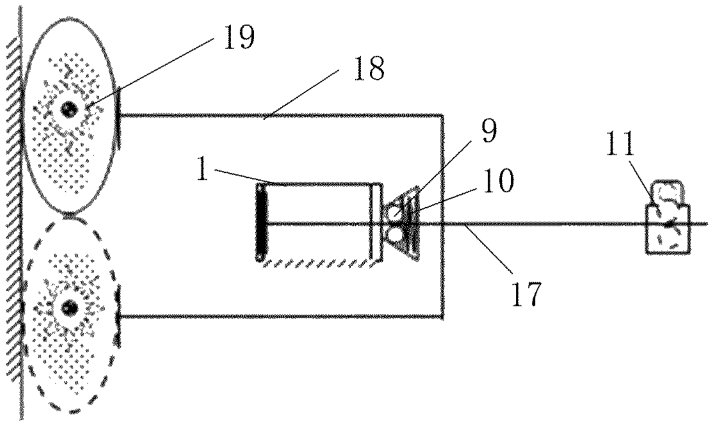
FIG. 13 is a schematic structural diagram of unstable energy collection in an energy collection system, where a state in which energy is not collected is presented.
Figure 14:
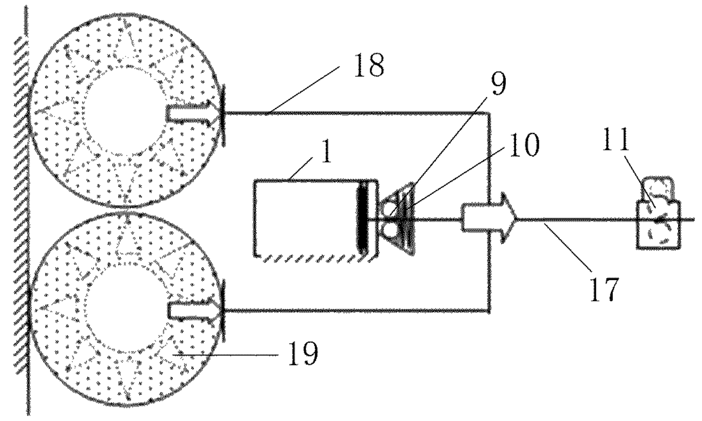
FIG. 14 is a schematic structural diagram of unstable energy collection in an energy collection system, where a state in which energy is collected is presented.

As shown in FIG. 13 and FIG. 14, the transmission part 2 includes a transmission rod 17 and a transmission frame 18, and the power source includes an energy body 19 and an electric motor 11, where the energy body 19 may be biological energy, explosion energy, combustion energy, physical phase change energy (steam expands for pushing, and the steam may be formed by means of electrical heating or charcoal fuel or fossil fuel combustion; and phase change thermal expansion materials may be obtained by means of isolated heating or thermal radiation heating (indirect contact), and for an internal implementation, materials including paraffin, volatile liquid/gas, alcohol, water, and hydrogen may be placed) or the like. When an external volume of the energy body 19 is increased due to the release of internal energy, the energy body 19 pushes the transmission frame 18 to drive the transmission rod 17 to move rightwards so that the sealed end 101 can be driven to move rightwards, thereby storing the negative pressure energy inside the sealed space 3. When the locking assembly is unlocked, the transmission rod 17 can drive the electric motor 11 to generate power so as to implement energy release. Therefore, the apparatus can implement the recovery of external biological energy, explosion or combustion energy, etc. In the same way, if the energy body 19 is wave, wind and other energy, the transmission frame 18 can also be pushed in an unstable form to implement energy collection.

Figure 16:
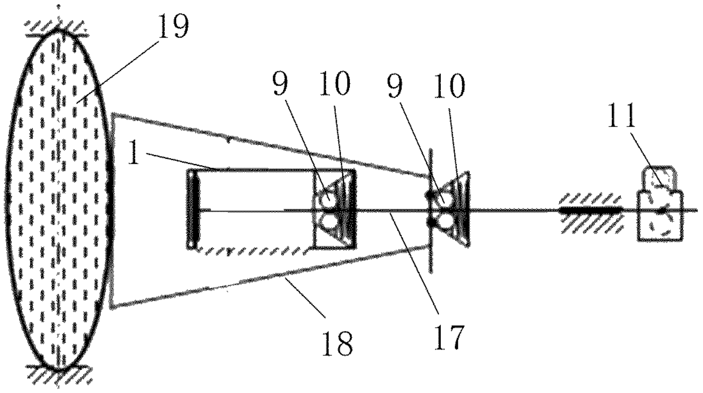
FIG. 16 is a schematic structural diagram of unstable energy collection in an energy collection system, where a state in which energy is not collected is presented, and a transmission frame has a function of automatic reset.
Figure 17:
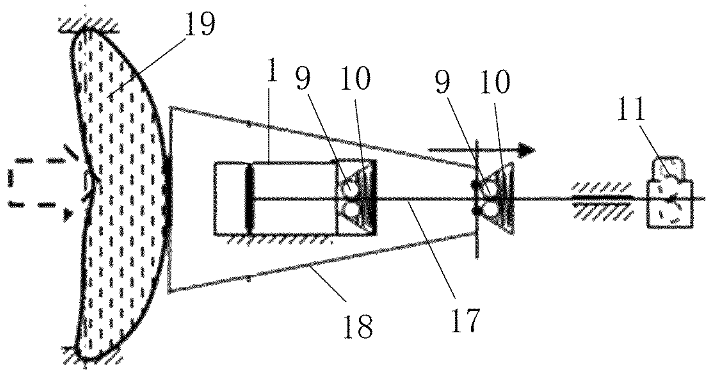
FIG. 17 is a schematic structural diagram of unstable energy collection in an energy collection system, where a state in which energy is collected is presented, and a transmission frame has a function of automatic reset.
Figure 18:
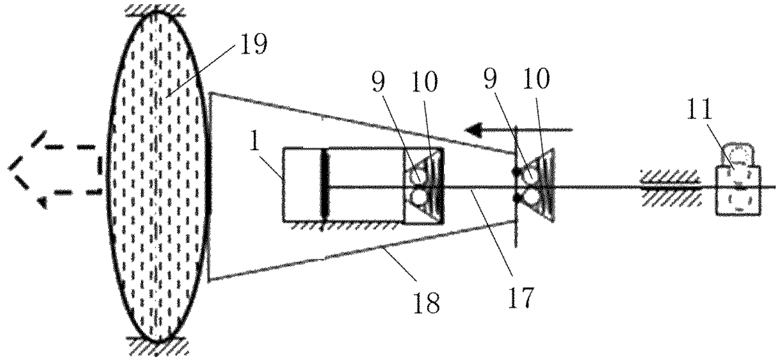
FIG. 18 is a schematic structural diagram of unstable energy collection in an energy collection system, where a transmission frame is being reset when energy collection is completed.

As shown in FIG. 16, FIG. 17, and FIG. 18 which are variations of FIG. 13 and FIG. 14, when the energy body 19 deforms under the action of the external energy to drive the transmission frame 18 to move for implementing the energy collection, the energy body 19 is preferably in firm connection with the transmission frame 18. When the external energy decreases or disappears, the energy body 19 itself restores and drives the transmission frame 18 and one locking assembly to reset. When the external energy acts on the energy body 19 again to cause deformation, the transmission frame 18 is driven to move again so as to implement the energy collection. By repeating the process in this way, unstable energy or single small energy is accumulated to become large energy, and stable and available large energy is collected and utilized through unlocking and the negative pressure release.

It is to be pointed out that during the energy release process of the system in FIG. 16, FIG. 17, and FIG. 18, two locking assemblies arranged on the transmission rod 17 both should be unlocked if the energy body 19 is in the process of expansive deformation.

The energy collection system in the present invention can convert unstable motion or energy in nature or made artificially into stable and controllable motion or energy, that is, the external energy may be stable energy or unstable energy, for example, the external energy may be from sea tides, crashing waves, falling objects, spring rebound, gas expansion, explosive/nuclear blasting, windmill, hydraulic or solar power generation, people walking on the ground, vehicles running on the road, electromechanical system energy, vibration impact energy, sound energy, thermal energy and so on. According to the present invention, the unstable motion or energy, micro/short-range energy, or short-term/transient energy can be converted, accumulated, stored and controlled, and the release of the stored energy can be controlled in accordance with the input motion and energy generation requirements, thereby forming desired stable and controllable object motion or energy supplied in a stable form.

In this embodiment, the transmission part 2 has a third state between the locking state and the unlocking state, where the third state is capable of maintaining uniform, accelerated, or decelerated motion of the transmission part 2 during the process that the negative pressure energy is released. In actual operation, the trigger body 8 can be used to drive the rolling element 9 and the transmission part 2 to maintain a proper frictional force therebetween so that the uniform, accelerated, or decelerated motion of the transmission part 2 can be adjusted, thereby implementing a preset release or conversion of the energy.

In the present invention, the storage of the negative pressure energy in the sealed space 3 can be implemented by first ensuring a good sealing effect between the sealed end 101 and the energy storage housing 1. The sealed end 101 in the present invention may be implemented in various structural forms. A structure of a typical embodiment of the sealed end 101 is described below.

Figure 2:
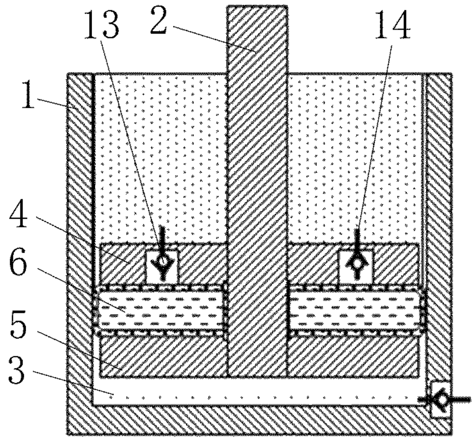
FIG. 2 is a schematic structural diagram of a sealed end.
Figure 3:
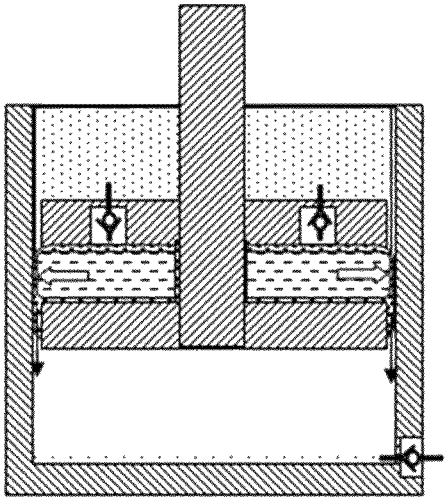
FIG. 3 is a schematic structural diagram of a sealed end when a sealed space is vacuumized.

In this embodiment, the sealed end 101 along the direction from the second position to the first position includes first piston bodies 4, second piston bodies 5, and flexible bodies 6 arranged between the first piston bodies 4 and the second piston bodies 5, which are sequentially sleeved on the transmission part 2 at intervals and matched with the energy storage housing 1. As shown in FIG. 2 and FIG. 3, when the sealed space 3 is in a negative pressure state, parts of the flexible bodies 6 are squeezed into gaps between the second piston bodies 5 and the energy storage housing 1 under the action of the atmospheric pressure so that the sealed space 3 is sealed.

In order to enhance the sealing effect, an inner wall of the energy storage housing 1 is coated with lubricating oil to form a lubricating oil film, which can enhance the sealing effect between the sealed end 101 and the inner wall of the energy storage housing 1.

It is to be noted that the flexible body 6 in this embodiment has an elastic self-lubricating effect when the sealed space 3 is in the negative pressure state. Specifically, one of the first piston bodies 4, one of the second piston bodies 5, and one of the flexible bodies 6 form a sealing assembly. In order to achieve the sealing effect, one sealing assembly can be configured on the transmission part 2, or a plurality of sealing assemblies can be configured to be sequentially connected in series to the transmission part 2 to achieve a better sealing effect.

Specifically, the flexible body 6 may be of a solid elastic structure or an elastic bag body, where the elastic bag body is filled with a fluid, and the fluid may be gas, liquid, or tiny (self-lubricating) solid particles (such as nanospheres). When the elastic bag body is adopted, the flexible body 6 is provided with a second valve 13 and a third valve 14, and the second valve 13 and the third valve 14 are both one-way valves, where the fluid in the flexible body 6 can flow out through the second valve 13 to facilitate motion of the sealed end 101 towards the second position, and the fluid is supplemented into the flexible body 6 via the third valve 14 to facilitate sealing of the sealed space 3.

In a specific implementation process, the power source in the present invention may be implemented in various forms, and may be not only in a form of including the energy body 19, but also in a combined form of including any one of the following structures.

In the combined form 1, a fluid transfer pump is configured to perform vacuumizing and fluid filling on the sealed space. There is provided an example where the fluid is used as a gas phase. The motion of the sealed end 101 and the vacuumizing of the sealed space 3 are both completed by the fluid transfer pump. During the operation, first, the sealed space 3 is filled with gas by the fluid transfer pump to push the sealed end 101 to move from the first position to the second position, and at this time, the transmission part 2 is locked; and then, the fluid transfer pump pumps out the gas in the sealed space 3 to implement the vacuum state in the sealed space 3. When the energy is released, the transmission part 2 is unlocked, and after unlocking, the energy can be released by the output end 102 under the action of the earth atmosphere, for example, output energy exerts corresponding pulling and dragging forces on the output end 102 to implement energy release.

In the combined form 2, a fluid transport pump and an electric motor 11 are used, where the fluid transport pump is configured to perform vacuumizing and push the sealed end 101 to move from the first position to the second position; and on the basis of the principle of the combined form 1, the electric motor 11 can be driven by the transmission part 2 to generate power, and the electric motor 11 is configured to convert the negative pressure energy outputted by the output end 102 into the electric energy. In actual arrangement, the output end 102 may be connected to the electric motor 11 in cooperation with a gear set, or the power generation of the electric motor 11 may be implemented in other transmission modes. Specifically, as shown in FIG. 1, the fluid transport pump is connected to the sealed space 3 by the first valve 12. When the sealed end 101 is in the first position and the transmission part 2 is adjusted to be in the unlocking state, the sealed space 3 is filled with gas by the fluid transport pump to push the sealed end 101 to move from the first position to the second position, then the transmission part 2 is adjusted to be in the locking state, and the sealed space 3 is vacuumized by the fluid transport pump, such that the storage of the negative pressure energy in the sealed space 3 is implemented. When the energy needs to be outputted, the transmission part 2 is adjusted to be in the unlocking state, then the sealed end 101 is pushed and moves towards the first position under the action of the atmospheric pressure of the earth, and at this time, the electric motor 11 can be driven to generate power, such that the conversion from the negative pressure energy to the electric energy is implemented.

In the combined form 3, a fluid transport pump is configured to perform vacuuming. When only the fluid transport pump is used, it can be understood from the embodiment in FIG. 6. The fluid transport pump is preferably a vacuum pump, and only implements vacuuming of the sealed space 3. When the sealed end 101 moves to the first position, the sealed end 101 is pushed to the second position under the action of the first spring 7 after a fourth valve 15 is opened. After the fourth valve 15 is closed, the fluid transport pump can be started to vacuumize the sealed space 3 again, thereby implementing a state in which the negative pressure energy is stored inside the sealed space 3.

In the combined form 4, an electric motor 11 is capable of driving the sealed end 101 to move from the first position to the second position and having a function of generating power. In this combined form, the motion of the sealed end 101 from the first position to the second position and the vacuumizing of the sealed space 3 both depend on power of the electric motor 11. When the sealed end 101 is in the second position, the sealed space 3 is in the vacuum state, and the transmission part 2 is in the unlocking state, the output end 102 can drive the electric motor 11 to operate and generate power, where the electric motor 11 is preferably a permanent magnet three-phase alternating current synchronous electric motor, and the electric motor has dual performances of a motor and a generator.

In the combined form 5, an electric motor 11 only has a function of generating power. The external energy can directly drive the transmission part 2 to move and drive the sealed end 101 to move towards the second position so that a vacuum is formed in the sealed space 3. The embodiments shown in FIG. 13 to FIG. 18 are all forms related to the combined form 5. The combined form of this structure is particularly applicable to the implementation of power generation by collecting unstable energy such as wave energy, wind energy, explosion energy, and thermal energy.

Figure 19:
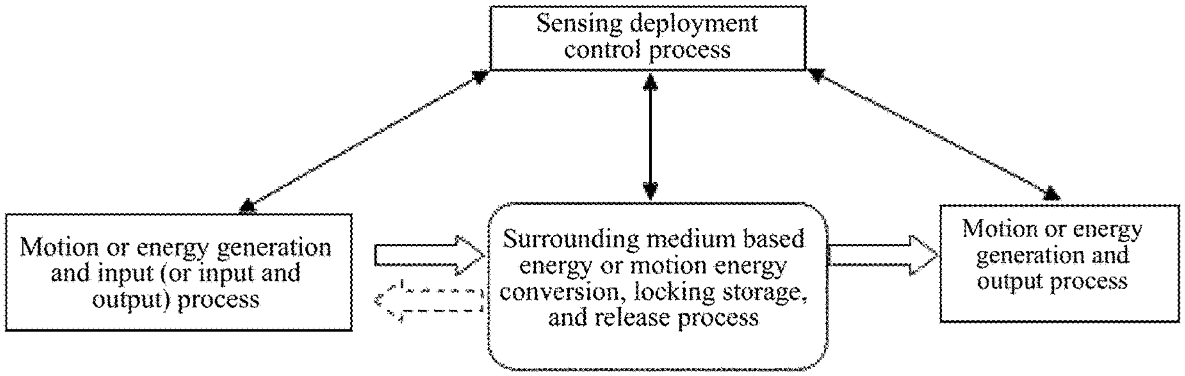
FIG. 19 is a schematic diagram of a control principle of an energy collection system.
Figure 20:
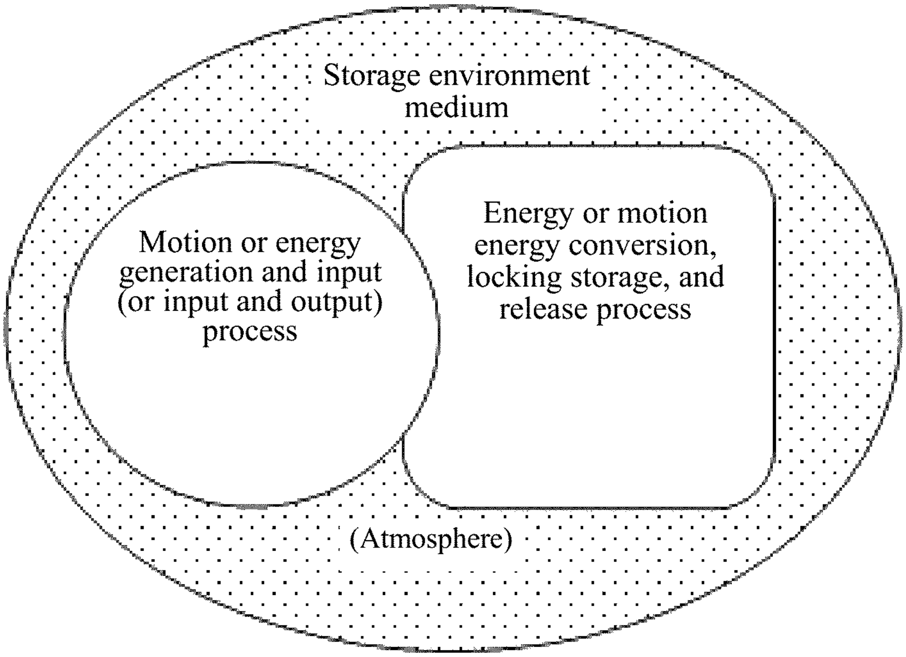
FIG. 20 is a schematic diagram of an atmosphere energy storage principle of an energy collection system.

A control mechanism is further included in the present invention, where the control mechanism is in signal connection with the power source and the locking assembly, such that the negative pressure energy is released or supplemented in a set manner. Actions of the power source and the locking assembly can be controlled by the control mechanism. In a specific implementation process, corresponding sensors and detectors may be matched to implement orderly execution of all processes of energy storage and release. As shown in FIG. 19 and FIG. 20, various forms of energy collection and release are showed, where in a sensing deployment control process, the detection and control of the whole system are implemented by the control mechanism, the sensors, and the detectors to ensure orderly execution of energy storage and release. A specific form of energy collection and release may be implemented by cooperation of a motion or energy generation and input (or integrated input and output) process, a surrounding-medium-based energy or motion energy conversion process, a locking storage and release process, and a motion or energy generation and output process.

The energy collection system based on earth atmosphere energy storage in the present invention may be applied to an energy storage and power generation integrated power plant, and has the advantages of simpler energy storage and release operations, safety, and no pollution.

An embodiment of the present invention further provides an energy storage apparatus, including a plurality of energy collection systems based on earth atmosphere energy storage that are arranged in series or in parallel. Specifically, different energy collection systems based on earth atmosphere energy storage are implemented in any one or more of the following forms:

- respective transmission parts 2 have the same, partially identical, or totally different heights and/or orientations;
- respective transmission parts 2 have the same, partially identical, or totally different structures, and respective structures can be flexibly selected according to actual working conditions;
- respective transmission parts 2 have the same, partially identical, or totally different states, and the states are positional states of the transmission parts 2 between a first position and a second position, that is, energy storage and release may be synchronously or asynchronously performed;
- respective locking assemblies have the same, partially identical, or totally different structures, and the systems may use the respective locking assemblies to match respective scenes; and
- respective power sources are in the same, partially identical, or totally different forms.

Figure 8:
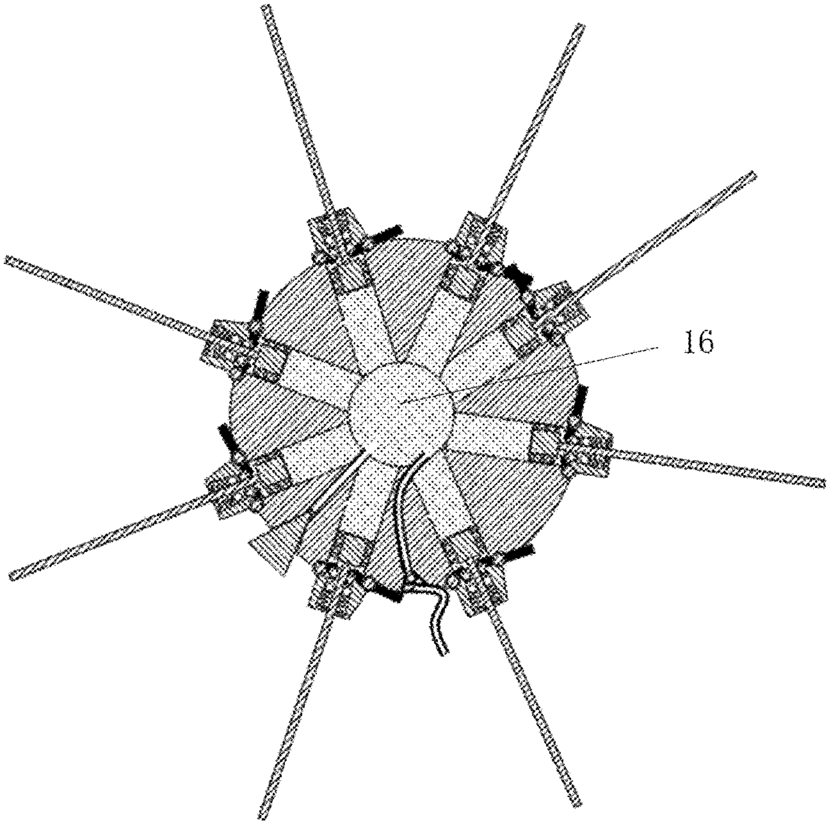
FIG. 8 is a schematic structural diagram in which a plurality of energy collection systems based on earth atmosphere energy storage in an energy storage apparatus are arranged in parallel, where sealed spaces are not vacuumized.
Figure 9:
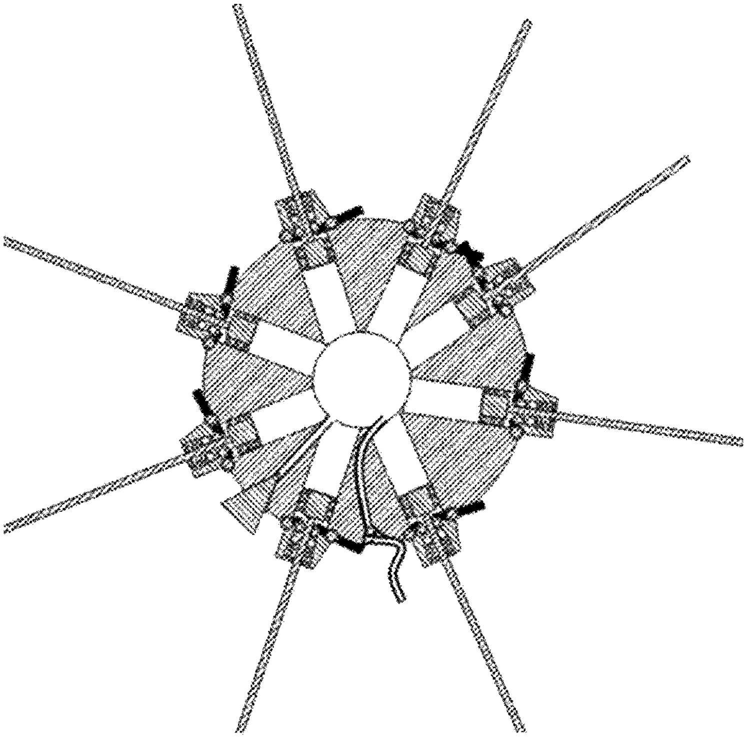
FIG. 9 is a schematic structural diagram in which a plurality of energy collection systems based on earth atmosphere energy storage in an energy storage apparatus are arranged in parallel, where sealed spaces are vacuumized.
Figure 10:
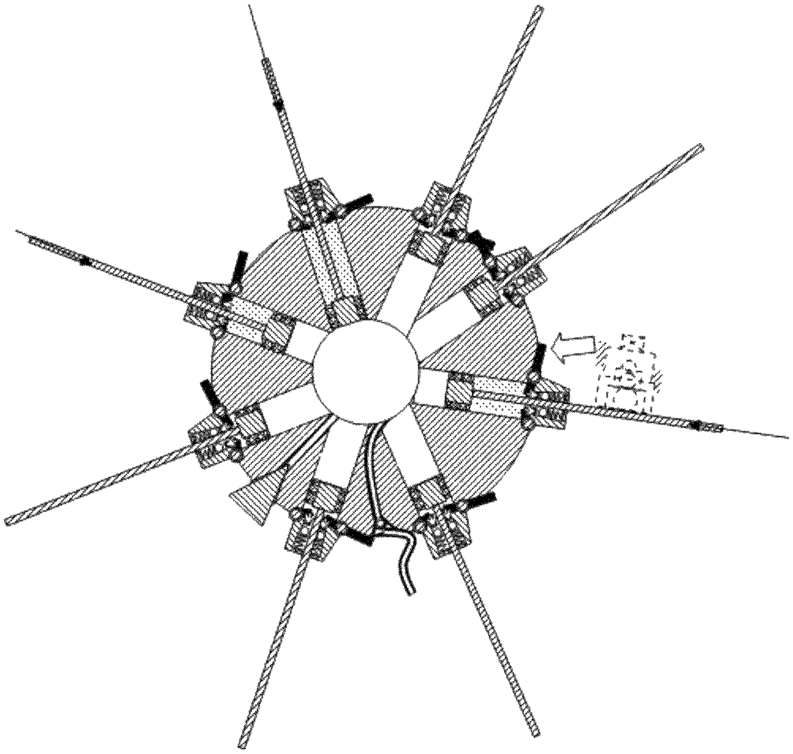
FIG. 10 is a schematic structural diagram in which a plurality of energy collection systems based on earth atmosphere energy storage in an energy storage apparatus are arranged in parallel, where sealed spaces are vacuumized and some systems have converted negative pressure energy into energy in other forms.

As shown in FIG. 8, the plurality of energy collection systems based on earth atmosphere energy storage that are arranged in parallel share a common chamber 16, and the common chamber 16 is filled up with a fluid. As shown in FIG. 9, after the fluid is pumped away, the common chamber 16 and a plurality of sealed chambers connected to the common chamber 16 are all in a vacuum state. As shown in FIG. 10, energy release of the plurality of systems may be performed asynchronously, and the orientations of the transmission parts 2 are different, such that asynchronous actions of the plurality of different systems may be implemented, thereby making energy storage and release more flexible.

Figure 15:
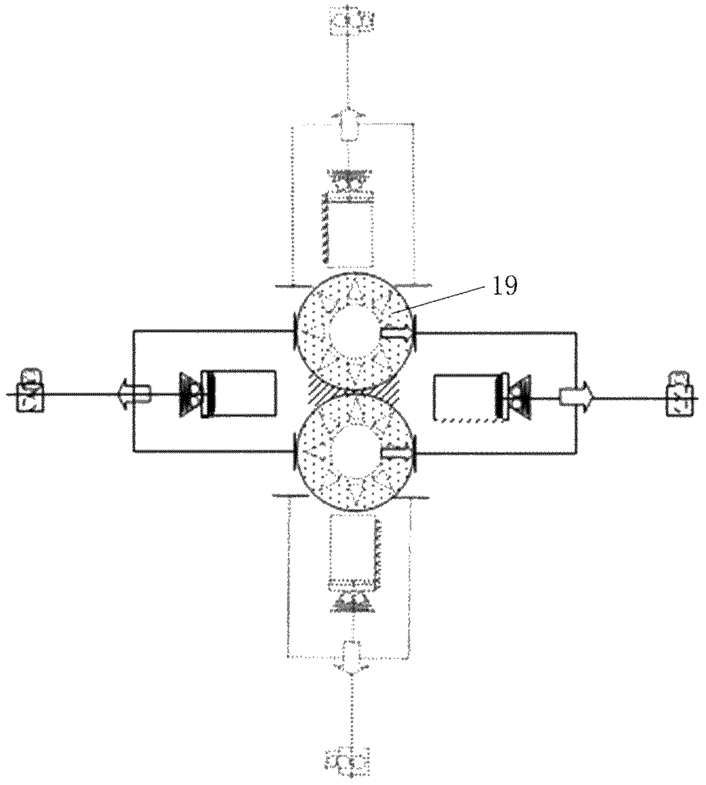
FIG. 15 is a schematic structural diagram of unstable energy collection in an energy collection apparatus, where a state in which energy is collected is presented.

FIG. 15 shows an implementation form of parallel arrangement of a plurality of energy collection systems based on earth atmosphere energy storage, with the performance of stable and unstable energy collection.

Figure 11:
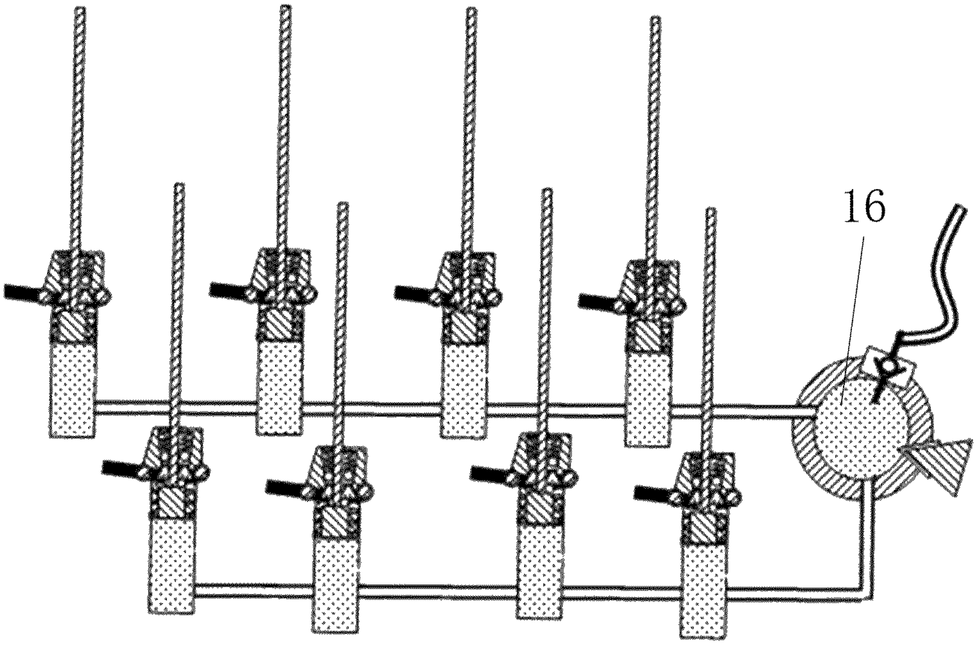
FIG. 11 is a schematic structural diagram in which a plurality of energy collection systems based on earth atmosphere energy storage in an energy storage apparatus are arranged in series, where transmission parts have the same orientation and partially identical heights.
Figure 12:
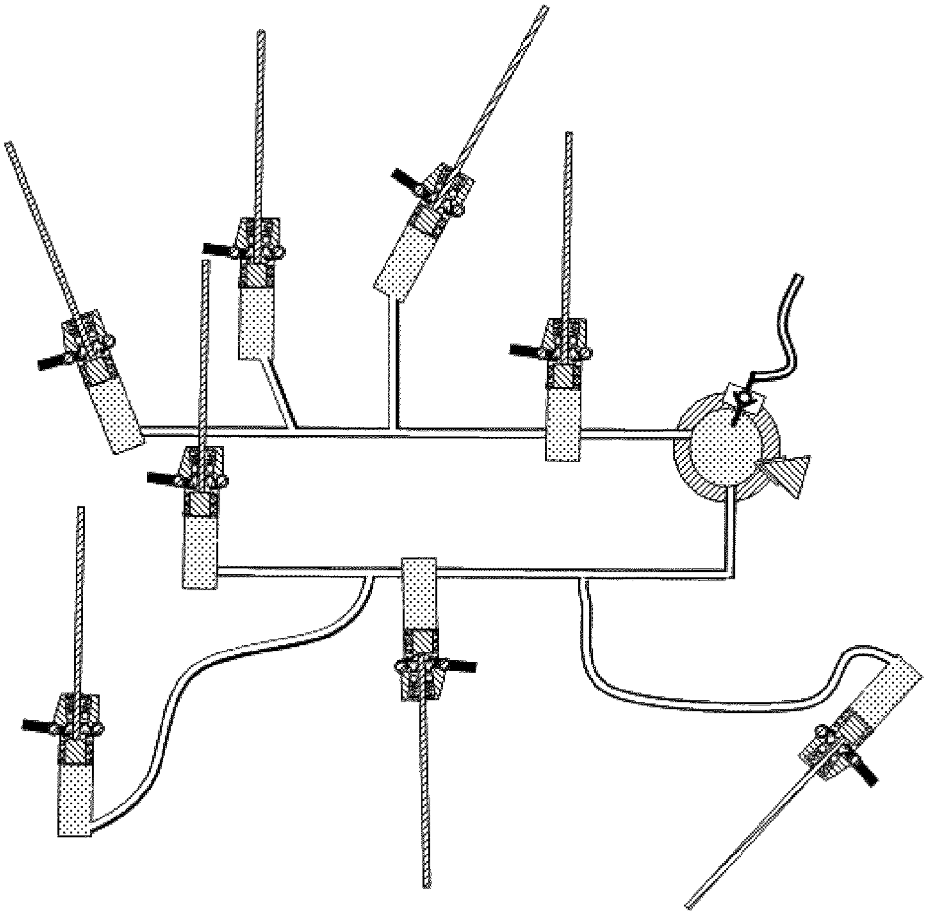
FIG. 12 is a schematic structural diagram in which a plurality of energy collection systems based on earth atmosphere energy storage in an energy storage apparatus are arranged in series, where transmission parts all have partially identical orientations and heights.

As shown in FIG. 11, the plurality of energy collection systems based on earth atmosphere energy storage that are arranged in series share a common chamber 16, such that synchronous or asynchronous actions of the plurality of different systems may be implemented, thereby making energy storage and release more flexible. In the practical application, the orientation and height of the transmission part 2 may also be flexibly set according to the practical application scenes, as shown in FIG. 12.

An embodiment of the present invention further provides an energy collection method based on earth atmosphere energy storage, including the following steps:

S1: enabling external energy to act on a transmission part 2 once or repeatedly so that a sealed end 101 of the transmission part 2 moves in a first direction to expand a sealed space 3 between the sealed end 101 and an energy storage housing 1 carrying the sealed end 101, and due to a locking assembly on the transmission part 2, not allowing the sealed end 101 to move in a second direction, where the sealed space 3 is a negative pressure space, and the first direction is opposite to the second direction; and S2: when the locking assembly is unlocked, enabling the sealed end 101 to move in the second direction under the action of earth atmosphere, where the transmission part 2 has an output end 102, and when the sealed end 101 moves in the second direction, the output end 102 is driven to move so that the sealed space 3 is reduced.

Specifically, the sealed end 101 is movable between a first position and a second position in the energy storage housing 1, where a direction of motion from the first position to the second position is the first direction; when the sealed end 101 is located between the first position and the second position, S1 and S2 are performed sequentially or alternately; when the sealed end 101 is located in the first position, S1 and S2 are performed sequentially; and when the sealed end 101 is located in the second position, S2 is performed first and then S1 is performed.

Embodiment 2

This embodiment is a variation of Embodiment 1.

In this embodiment, a first spring 7 is disposed in the sealed space 3. As shown in FIG. 4 to FIG. 7, the first spring 7 has one end connected to the sealed end 101 and the other end connected to the energy storage housing 1, where the first spring 7 is always in a compressed state.

Figure 4:
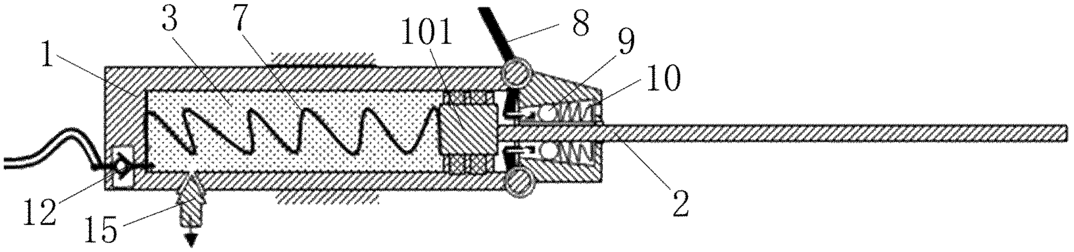
FIG. 4 is a schematic structural diagram in which a sealed end is in a second position and a sealed space is not vacuumized when there is a first spring.
Figure 5:
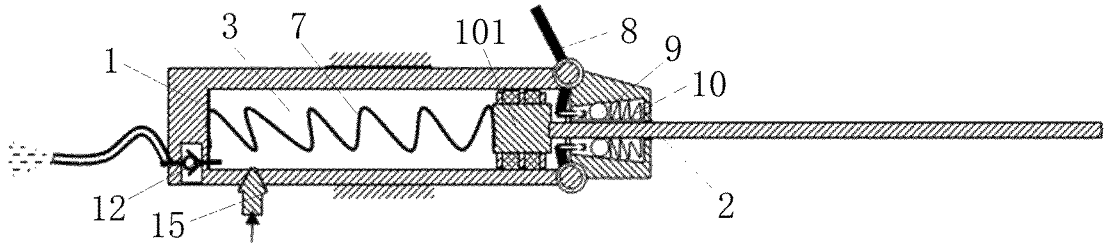
FIG. 5 is a schematic structural diagram in which a sealed end is in a second position and a sealed space is vacuumized when there is a first spring.
Figure 7:
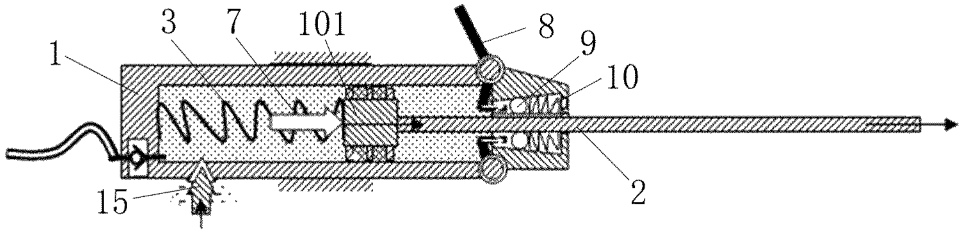
FIG. 7 is a schematic structural diagram in which a sealed end moves from a first position to a second position when there is a first spring.

In this embodiment, a fourth valve 15 is disposed on the energy storage housing 1, and the sealed space 3 can communicate with the outside atmosphere by the fourth valve 15. As shown in FIG. 4, the sealed end 101 is in the second position, and the fourth valve 15 is closed. The first valve 12 is preferably a one-way valve, an inlet end of the fluid transport pump is connected to the sealed space 3 by the first valve 12, and the fluid transport pump is started to vacuumize the sealed space 3, as shown in FIG. 5. After vacuumizing is completed, when the negative pressure energy in the sealed space 3 needs to be released, the transmission part 2 is adjusted to be in the unlocking state, and the sealed end 101 drives the transmission part 2 to move towards the first position under the action of the atmospheric pressure of the earth so that the energy is outputted until the sealed end 101 moves to the first position, as shown in FIG. 6. At this time, the fourth valve 15 is opened, the outside atmosphere enters the sealed space 3, and the sealed end 101 is pushed to move towards the second position again under the action of an elastic force of the first spring 7, as shown in FIG. 7.

Figure 21:
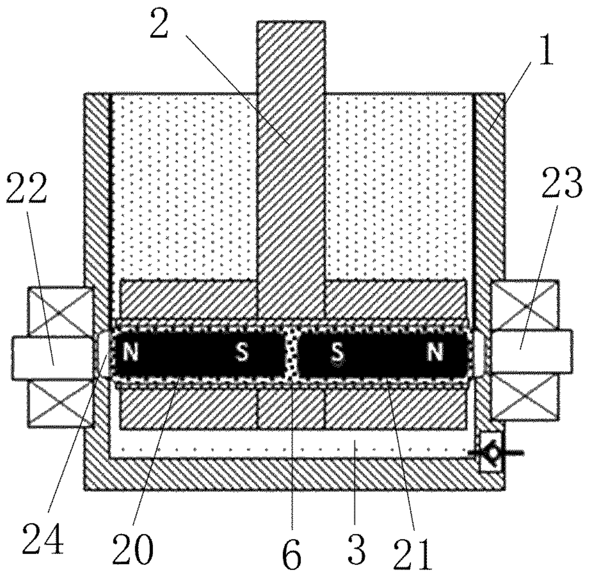
FIG. 21 is a schematic structural diagram of a sealed end in Embodiment 2, where an electromagnet is not energized.
Figure 22:
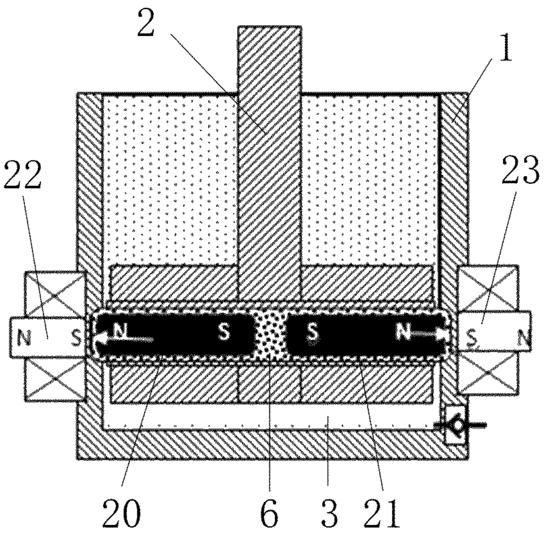
FIG. 22 is a schematic structural diagram of a sealed end in Embodiment 2, where an electromagnet has been energized.

In this embodiment, a first permanent magnet 20 and a second permanent magnet 21 are arranged in the flexible bodies 6 of the sealed end 101 respectively. As shown in FIG. 21 and FIG. 22, a first electromagnet 22 and a second electromagnet 23 are arranged outside the energy storage housing 1, the first electromagnet 22 and the second electromagnet 23 are corresponding to the first permanent magnet 20 and the second permanent magnet 21 respectively, and magnetic poles of opposite ends of the first electromagnet 22 and the second electromagnet 23 are opposite. The first electromagnet 22 and the second electromagnet 23 are energized to generate electromagnetic fields and attract the first permanent magnet 20 and the second permanent magnet 21 respectively, such that parts, in contact with an outer wall of the energy storage housing 1, of the flexible bodies 6 are in close contact under the action of magnetic forces to implement sealing.

Figure 23:
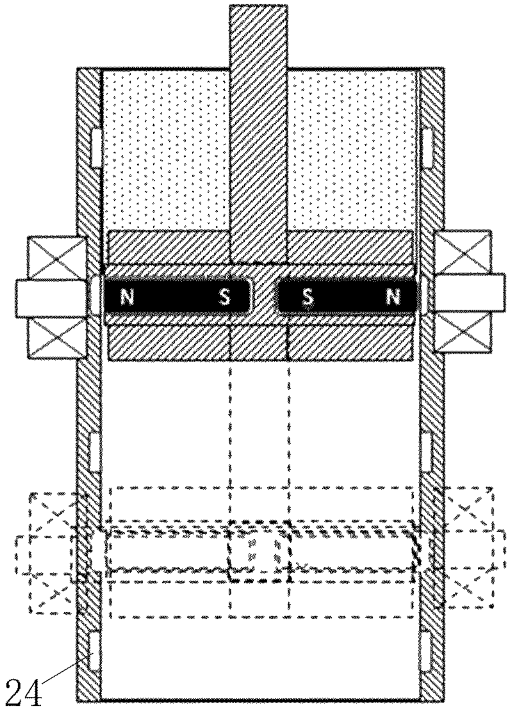
FIG. 23 is a schematic structural diagram of a sealed end in Embodiment 2, where a sealing groove is formed on an inner wall of an energy storage housing.

Further, in practical application, a plurality of uniformly or non-uniformly arranged sealing grooves 24 may be axially formed inside the energy storage housing 1, and the sealing grooves 24 are all arranged in a position where the sealed end 101 stops. As shown in FIG. 22 and FIG. 23, when the sealed end 101 stops, the flexible bodies 6 can be exactly embedded into the sealing grooves 24, such that the sealed chambers 3 keep a better static sealing state after the transmission part 2 stops moving. This structure is particularly applicable to application scenes with fixed displacement output for energy release.

Embodiment 3

This embodiment is another variation of Embodiment 1.

Figure 24:
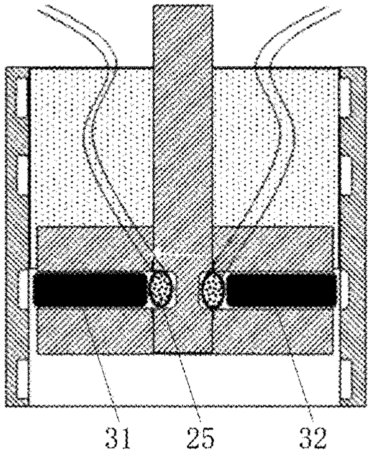
FIG. 24 is a schematic structural diagram of a sealed end in Embodiment 3, where a first bag body is not heated.
Figure 25:
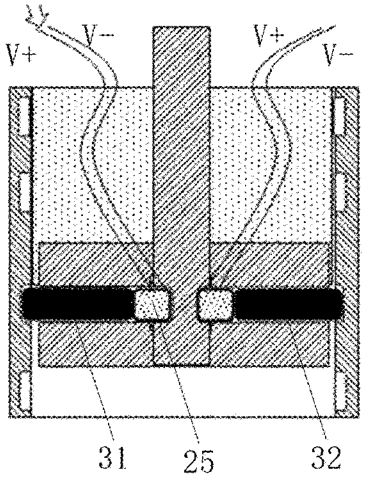
FIG. 25 is a schematic structural diagram of a sealed end in Embodiment 3, where a first bag body has been heated.

In this embodiment, a first moving block 31, a second moving block 32 and first bag bodies 25 arranged along the circumferential direction of the transmission part 2 are disposed in the flexible bodies 6 of the sealed end 101 respectively, the first bag bodies 25 are arranged on inner sides of the first moving block 31 and the second moving block 32, and the first moving block 31 and the second moving block 32 are preferably permanent magnets. As shown in FIG. 24, the first bag bodies 25 are filled with phase change materials such as paraffins, and the phase change materials undergo phase change by heating the first bag bodies 25 and then change in volume to generate pushing forces for the first moving block 31 and the second moving block 32 so that the first moving block 31 and the second moving block 32 can push the flexible bodies 6 to squeeze the inner wall of the energy storage housing 1, thereby improve the sealing effect. FIG. 25 shows a case where the phase change materials in the first bag bodies 25 increase in volume after undergoing the phase change. Through the arrangement of this structure, the parts, in contact with the outer wall of the energy storage housing 1, of the flexible bodies 6 are in close contact to implement sealing, where a flexible structure for sealing is disposed outside each of the first moving block 31 and the second moving block 32 to ensure sealed contact with the inner wall of the energy storage housing 1.

The phase change materials may be heated by means of electric heating.

It is to be noted that the above structure for sealing the sealed end 101 may also be used in the locking assembly for locking and unlocking, and can also achieve the effects of some special scenes in the present invention.

Embodiment 4

This embodiment is a variation of Embodiment 3.

This embodiment provides a structural interference locking structure, which implements locking and unlocking of the locking assembly based on the principle of Embodiment 3.

Figure 26:
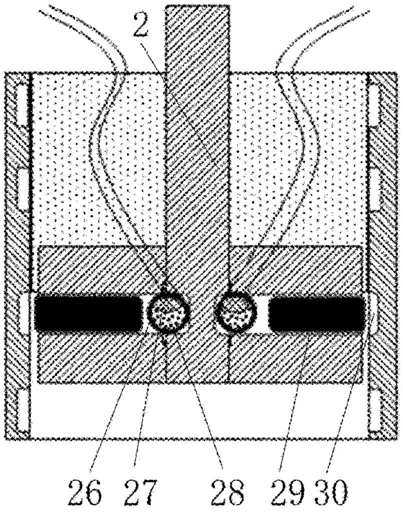
FIG. 26 is a schematic structural diagram of a locking assembly in Embodiment 4, where two phase change materials in a second bag body are both not heated.

As shown in FIG. 26, second bag bodies 26 and locking stopper blocks 29 are disposed in the circumferential direction of the transmission part 2 and arranged radially outwards in sequence. The second bag body 26 is filled with two phase change materials having a certain difference in phase change temperature, and the two phase change materials may be heated simultaneously or separately.

Figure 27:
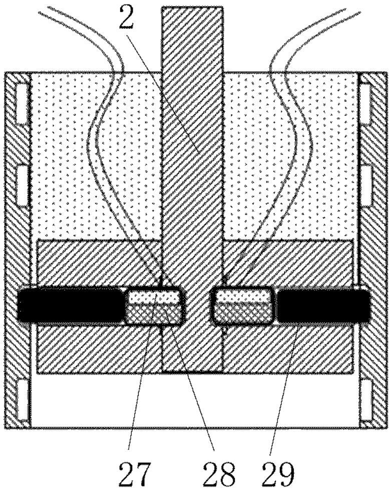
FIG. 27 is a schematic structural diagram of a locking assembly in Embodiment 4, where two phase change materials in a second bag body have been both heated.
Figure 28:
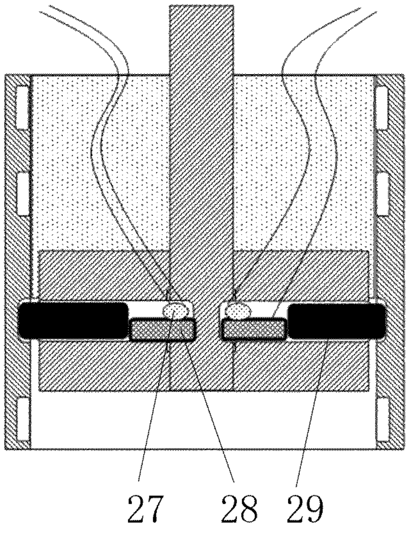
FIG. 28 is a schematic structural diagram of a locking assembly in Embodiment 4, where two phase change materials in a second bag body have been both cooled.

When the two phase change materials are electrically heated, one phase change material with a low melting point, such as a paraffin 27, is liquefied or gasified first, and the other phase change material with a high melting point, such as a bismuth-tin alloy 28, is pressurized and squeezed. When heated to over 70° C., the tin-bismuth alloy 28 begins to melt, and the liquefied or gasified material expands to squeeze the melting tin-bismuth alloy to be arranged in a direction where the locking stopper block 29 slides outward. As shown in FIG. 27, the locking stopper blocks 29 are simultaneously squeezed and pushed outwards so that end parts of the locking stopper blocks 29 enter locking grooves 30 to implement sealing and locking. Then, cooling is performed. The tin-bismuth alloy 28 begins to be solidified first due to the high melting point, and the other phase change material with the low melting point around it is still in a high-pressure gaseous or liquid state. At this time, the bismuth-tin alloy 28 melted and arranged along the pushing direction is gradually cooled and solidified, and then the other phase change material, namely the paraffin 27 is cooled to become liquid or small solid. However, because the bismuth-tin alloy 28 has already been solidified and shaped, it is in a state where the locking stopper block is resisted to be outwards pushed, and a no-energy locking state is formed, as shown in FIG. 28.

If secondary heating is performed, the two phase change materials may be softened at the same time through temperature control. Because the second bag body 26 is in a negative pressure state, the locking stopper block 29 will move with the second bag body 26, such that the locking state is released for unlocking.

Embodiment 5

This embodiment is yet another variation of Embodiment 1.

Figure 29:
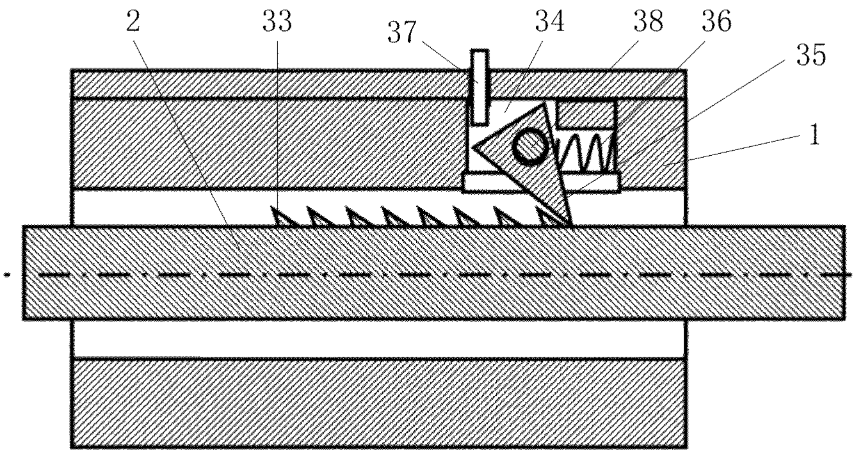
FIG. 29 is a schematic structural diagram of ratchet mechanism locking in Embodiment 5.

This embodiment provides a ratchet mechanism locking structure, including a locking structure body 35, a third spring 36, and an unlocking functional part 37, where stopping teeth 33 are disposed on the transmission part 2, an accommodating space 34 is disposed inside the energy storage housing 1, one end of the locking structure body 35 is rotatably mounted in the accommodating space 34 by a stationary shaft 38 and is in elastic fit with the third spring 36 mounted on the energy storage housing 1, and the other end of the locking structure body 35 extends outside the accommodating space and is in running fit with the stopping teeth 33. As shown in FIG. 29, when the transmission part 2 moves in the first direction, the locking structure body 35 cannot stop the transmission part 2 from driving the stopping teeth 33 to move, and when the transmission part 2 moves in the second direction, the locking structure body 35 stops the transmission part 2 from driving the stopping teeth 33 to move and can perform locking. When the unlocking functional part 37 is operated to move towards the transmission part 2, the other end of the locking structure body 35 can move away from the stopping teeth 33 so that the transmission part 2 is movable in the first direction and the second direction without being locked. The locking and unlocking operations in the present invention are implemented by the above operations.

FIG. 16, FIG. 17, and FIG. 18 are taken as an example showing the working principle of the present invention as follows:

When the energy body 19 deforms toward the transmission frame 18 under the action of external unstable energy, a force is applied to the transmission frame 18 to drive the transmission frame 18 to move rightwards. Because the locking assembly directly connected to the transmission frame 18 is in the locking state in a rightward direction, the transmission rod 17 is driven to move rightwards. Because the locking assembly arranged on the energy storage housing 1 allows the transmission rod 17 to move rightwards, the sealed end 101 is pulled rightwards by the transmission rod 17 so that the volume of the sealed space 3 is increased, and the negative pressure energy is collected and stored, as shown in FIG. 16 and FIG. 17.

When the external energy decreases or disappears, the energy body 19 itself restores and drives the transmission frame 18 and one locking assembly to reset. At this time, the transmission rod 17 allows the locking assembly directly connected to the transmission frame 18 to move leftwards, such that the resetting of the transmission frame 18 is not interfered by the locking assembly. When the external energy acts on the energy body 19 again to cause deformation, the transmission frame 18 is driven to move rightwards again to implement energy collection. By repeating the process in this way, the collection of unstable energy is implemented.

When the energy in the sealed space 3 needs to be released, only the locking assembly on the energy storage housing 1 needs to be adjusted to be in the unlocking state, and the sealed end 101 of the transmission part 2 can move from the second position to the first position under the action of the atmospheric pressure of the earth so as to drive the output end 102 to move synchronously. The output end 102 is connected to the motor 11. The motor 11 has the function of generating power. The transmission part 2 can drive the motor 11 to generate power so that the conversion from the negative pressure energy to the electric energy is implemented, until the sealed end 101 moves to the first position and the negative pressure energy is completely released.

In the description of the present application, it is to be understood that the orientations or positional relationships indicated by the terms “upper”, “lower”, “front”, “back”, "left", "right", "vertical", "horizontal", "top", "bottom", "inside", "outside", etc. are based on the orientations or positional relationships shown in the accompanying drawings, only for the convenience of describing the present application and simplifying the description rather than indicating or implying that the apparatus or element referred to must have a particular orientation or be constructed and operated in a particular orientation, and therefore should not be construed as a limitation to the present application.

Compared with the prior art, the present invention has the following beneficial effects:

1. According to the present invention, vacuum energy storage of the system is implemented with the sealed chamber in the vacuum state, and a driving force is generated with a pressure difference between the earth atmosphere and the sealed chamber. Equivalently, the atmospheric potential energy is stored between the earth atmosphere and the vacuum chamber, and the negative pressure in the sealed chamber can be released or converted under the action of the driving force generated with the pressure difference at any time as needed. The energy storage and release are less affected by external environments, no additional garbage will be produced, and the system has good environmental friendliness, high flexibility, good universality, and practical value and significance for promotion.

2. According to the present invention, the vacuum energy storage of the system may be implemented only with one negative pressure pump, and the energy can be released at any time as needed. The system is simple in structure, easy to implement, and low in cost.

3. According to the present invention, the system is made of conventional materials in a manufacturing process, and has few parts and low cost.

4. According to the present invention, the system is convenient to operate, and automated and remote management may be implemented with a control system.

5. The energy storage system in the present invention has the characteristic of high safety, and there is no explosion or other danger.

6. The present invention has the characteristic of low noise.

7. The present invention has more stable energy release performance during energy release, and has more stable energy release advantages compared with other energy storage.

8. According to the present invention, the system may be used at a fixed position or made into a portable energy storage device through further improvement, thereby having a wider range of use.

9. The system or apparatus in the present invention may be designed flexibly, and is designed to have a specific size and weight according to actual application scenes, thereby having strong practicability.

10. According to the present invention, the unstable motion or energy, micro/short-range energy, or short-term/transient energy can be converted, accumulated, stored and controlled, and the release of the stored energy can be controlled in accordance with the input motion and energy generation requirements. Thus, desired stable and controllable object motion or energy supplied in a stable form is formed, and the long-standing problem of difficulty in collecting the unstable energy is solved.

The specific embodiments of the present invention are described above. It is to be understood that the present invention is not limited to the specific embodiments described above, and that various changes or modifications may be made by those skilled in the art within the scope of the claims without affecting the spirit of the present invention. The embodiments in the present application and the features in the embodiments may be combined with each other under no conflict.

What is claimed is:

1. An energy collection system based on earth atmosphere energy storage, comprising:

an energy storage housing providing a carrier for energy storage;

a transmission part having a sealed end, wherein the sealed end is movably arranged inside or outside the energy storage housing, and a sealed space is formed between the sealed end and the energy storage housing;

a power source configured to drive the sealed end to move from a first position to a second position of the energy storage housing and to form a vacuum inside the sealed space; and a locking assembly enabling the transmission part to have a locking state and an unlocking state, wherein when the transmission part is in the unlocking state, the sealed end is movable in a direction from the second position to the first position under an action of earth atmosphere to release negative pressure energy in the sealed space, and an action of the locking assembly is performed in one of the following manners:

manual control;

program control, wherein a program is set to operate the locking assembly in a continuous or discontinuous state at a preset time point or in a preset time period, or operate the locking assembly based on conditional information;

combination of the manual control with the program control; and wherein the sealed end along the direction from the second position to the first position comprises first piston bodies, second piston bodies, and flexible bodies arranged between the first piston bodies and the second piston bodies, the first piston bodies and the second piston bodies are sequentially sleeved on the transmission part at intervals and matched with the energy storage housing, and when the sealed space is in a negative pressure state, parts of the flexible bodies are squeezed into gaps between the second piston bodies and the energy storage housing under an action of an atmospheric pressure to seal the sealed space.

2. The energy collection system according to claim 1, wherein the power source is in one or more forms of wind energy, solar energy, chemical energy, thermal energy, electrical energy, radiant energy, nuclear energy, kinetic energy, potential energy, biological energy, tidal energy, magnetic and electromagnetic energy, and physical phase change energy.

3. The energy collection system according to claim 1, wherein the transmission part has an output end; and the sealed end is pushed or/and pulled to move from the first position to the second position.

4. The energy collection system according to claim 3, wherein the output end extends outside the energy storage housing or is located inside the energy storage housing.

5. The energy collection system according to claim 1, wherein a vacuum environment in the sealed space is formed by motion of the sealed end and/or vacuumizing.

6. The energy collection system according to claim 1, wherein one of the first piston bodies, one of the second piston bodies, and one of the flexible bodies form a sealing assembly; and one or more sealing assemblies are configured on the transmission part.

7. The energy collection system according to claim 1, wherein the locking assembly is in one form of buckle locking, hole and pin type locking, electromagnetic force locking, thermal expansion locking, structural interference locking, ratchet mechanism locking, pneumatic and hydraulic locking, gluing locking, reaction force locking, and welding locking.

8. The energy collection system according to claim 7, wherein when the transmission part is in the locking state or the unlocking state, the transmission part is allowed to move in a direction from the first position to the second position.

9. The energy collection system according to claim 7, wherein a conical space is formed in the energy storage housing and has a first opening end facing the sealed space, and the locking assembly comprises a trigger body, a locking support member, and a potential energy storage part;

the potential energy storage part has a first end connected to the energy storage housing and arranged at a second opening end of the conical space, and a second end connected to the locking support member, the first opening end is smaller than the second opening end, the transmission part penetrates through the conical space, and the locking support member and the potential energy storage part are both arranged along a circumferential direction of the transmission part;

when the trigger body is operated, the locking support member is configured to be driven to move towards the second opening end to make the transmission part in the unlocking state; and when the trigger body is not operated, the potential energy storage part is configured to drive the locking support member to move towards the first opening end under an action of an elastic force of the potential energy storage part to make the transmission part in the locking state.

10. The energy collection system according to claim 9, wherein the transmission part has a third state between the locking state and the unlocking state, and in the third state, the transmission part keeps on uniform, accelerated, or decelerated motion during a process of releasing the negative pressure energy.

11. The energy collection system according to claim 1, wherein the power source comprises one of the following structural combination forms:

a fluid transfer pump configured to perform vacuumizing and fluid filling on the sealed space;

the fluid transport pump and an electric motor, wherein the fluid transport pump is configured to perform vacuumizing, and the electric motor is configured to be driven by the transmission part to generate power;

the fluid transport pump configured to perform vacuumizing; and the electric motor configured to drive the sealed end to move from the first position to the second position, and having a power generation function, or the electric motor only having the power generation function.

12. The energy collection system according to claim 11, wherein a first spring is disposed in the sealed space, the first spring has a first end connected to the sealed end and a second end connected to the energy storage housing, and the first spring is always in a compressed state.

13. The energy collection system according to claim 1, comprising a control mechanism, wherein the control mechanism is in signal connection with the power source and the locking assembly to release or supplement the negative pressure energy in a set manner.

14. An energy storage apparatus, comprising a plurality of energy collection systems based on earth atmosphere energy storage according to claim 1, wherein the plurality of energy collection systems are arranged in series or in parallel.

15. The energy storage apparatus according to claim 14, wherein different energy collection systems based on earth atmosphere energy storage are implemented in one or more of the following forms:

respective transmission parts have the same, partially identical, or totally different heights and/or orientations;

the respective transmission parts have the same, partially identical, or totally different structures;

the respective transmission parts have the same, partially identical, or totally different states, and the states are positional states of the transmission parts between a first position and a second position;

respective locking assemblies have the same, partially identical, or totally different structures; and respective power sources are in the same, partially identical, or totally different forms.

16. The energy storage apparatus according to claim 14, wherein the power source is in one or more forms of wind energy, solar energy, chemical energy, thermal energy, electrical energy, radiant energy, nuclear energy, kinetic energy, potential energy, biological energy, tidal energy, magnetic and electromagnetic energy, and physical phase change energy.

17. An energy collection method based on earth atmosphere energy storage, using the energy collection system according to claim 1, comprising the following steps:

S1: enabling external energy to act on the transmission part once or repeatedly to drive the sealed end of the transmission part to move in a first direction to expand the sealed space between the sealed end and the energy storage housing, and the locking assembly on the transmission part stops the sealed end from moving in a second direction, wherein the sealed space is a negative pressure space, and the first direction is opposite to the second direction; and S2: when the locking assembly is unlocked, enabling the sealed end to move in the second direction under an action of earth atmosphere.

18. The energy collection method according to claim 17, wherein the sealed end is movable between a first position and a second position in the energy storage housing, and a direction of motion from the first position to the second position is the first direction, wherein when the sealed end is located between the first position and the second position, S1 and S2 are performed sequentially or alternately;

when the sealed end is located in the first position, S1 and S2 are performed sequentially; and when the sealed end is located in the second position, S2 is performed first and then S1 is performed.

19. The energy storage apparatus according to claim 14, wherein the transmission part has an output end; and the sealed end is pushed or/and pulled to move from the first position to the second position.

* * * * *